(12) United States Patent
Abdel-Hamid et al.

(10) Patent No.: US 7,292,075 B2
(45) Date of Patent: Nov. 6, 2007

(54) RAIL-TO-RAIL PAD DRIVER WITH LOAD INDEPENDENT RISE AND FALL TIMES

(76) Inventors: Ahmed Kamal Abdel-Hamid, 101 Al Hakam Street, Helmyar Al Zaytoon, Flat 6, Cairo (EG); Tamer Ali Abdel-Rahim, 32 Ibn Al-Nafis Street, Nasr City, Cairo (EG)

( * ) Notice: Subject to any disclaimer, the term of this patent is extended or adjusted under 35 U.S.C. 154(b) by 90 days.

(21) Appl. No.: 11/029,957

(22) Filed: Jan. 4, 2005

(65) Prior Publication Data

US 2006/0145734 A1 Jul. 6, 2006

(51) Int. Cl.
*H03B 1/00* (2006.01)
*H03K 3/00* (2006.01)

(52) U.S. Cl. ...................... 327/111; 327/108

(58) Field of Classification Search ............... 327/170, 327/108–112
See application file for complete search history.

(56) References Cited

U.S. PATENT DOCUMENTS

| | | | |
|---|---|---|---|
| 5,487,018 A | 1/1996 | Loos et al. | |
| 5,598,119 A | 1/1997 | Thayer et al. | |
| 5,903,179 A * | 5/1999 | Kim ........................ | 327/309 |
| 6,115,298 A * | 9/2000 | Kwon et al. ............... | 365/198 |
| 6,181,542 B1 * | 1/2001 | Liang et al. ............... | 361/111 |
| 6,271,699 B1 | 8/2001 | Dowlatabadi | |

OTHER PUBLICATIONS

Chioffi, "High-Speed, Low-Switching Noise CMOS Memory Data Output Buffer", *IEEE Journal of Solid-State Circuits*, vol. 29, No. 11, Nov. 1994.
Dowlatabadi, "A Robust, Load-Insensitive Pad Driver", *IEEE Journal of Solid-State Circuits*, vol. 35, No. 4, Apr. 2000.
Hanafi et al., "Design and Characterization of a CMOS Off-Chip Driver/Receiver with Reduced Power-Supply Disturbance", *IEEE Journal of Solid-State Circuits*, vol. 27, No. 5, May 1992.
Senthinathan et al., "Application Specific SMOS Output Driver Circuit Design Techniques to Reduce Simultaneous Switching Noise", *IEEE Journal of Solid-State Circuits*, vol. 28, No. 12, Dec. 1993.
SEMI Draft Document 3626 Apr. 23, 2003, OASIS™—*Open Artwork System Interchange Standard*, SEMI 2003, 41 pp.

* cited by examiner

*Primary Examiner*—Dinh T. Le
(74) *Attorney, Agent, or Firm*—Klarquist Sparkman, LLP

(57) ABSTRACT

A pad driver is presented that in one form is capable of driving a wide range of capacitive loads with constant rise and fall times, over a wide range of temperature and process corners. A desirable form of the pad driver is characterized by the ability to charge and discharge rail-to-rail with a constant charging and discharging rate over the whole charging and discharging cycles. Furthermore, desirably the driver is independent of any load present at the output pad.

19 Claims, 11 Drawing Sheets

RAIL-TO-RAIL PAD DRIVER WITH LOAD INDEPENDENT RISE AND FALL TIMES

TECHNICAL FIELD

The technical field relates to input/output pads of an integrated circuit. More particularly, the field relates to circuits for driving output signals via the pads of an integrated circuit chip.

BACKGROUND

There has been significant research on various implementations of pad drivers for computer data communication and modern portable peripherals. The Universal Serial Bus (USB) standard is one of these common modern standards that result in tough specifications for pad drivers. Pad drivers ideally have a limited range of rise and fall times over a broad range of capacitive loads, process corners, supply voltages and temperature variations.

There are several known implementations of pad drivers. One known form of a current controlled pad driver is presented, in FIG. 1. In the pad driver of FIG. 1, the charging and discharging of the output is done through a current source. One drawback of this architecture is that the charging and discharging rates (slope=$I/C_L$) are a function of the load capacitance, and thus, rise and fall times are load dependent.

Another known implementation is illustrated in FIG. 2. The pad driver of FIG. 2 has a negative feedback to control the charging and discharging rates. In the pad driver of FIG. 2, the output is compared with a reference signal by a high-speed rail-to-rail common mode amplifier. However, one drawback of this architecture is the need for a high-speed operational amplifier, which introduces unnecessary complexities to modern high-speed communication applications.

Yet another known pad driver circuit is shown in FIG. 3. In the pad driver of FIG. 3, current sources $I_1$ and $I_2$ are used to charge and discharge capacitors $C_1$ and $C_2$, respectively. This in turn charges and discharges points $V_1$ and $V_2$, respectively, at a constant charging and discharging rate ($I_1/C_1=I_2/C_2$). The source followers MN1 and MP2 buffer the constant-rate charging and discharging of nodes $V_1$ and $V_2$, respectively, to the output load capacitance $C_{LOAD}$, thus, sustaining equal charging and discharging rates independent of the load value $C_{LOAD}$. A potential problem with the configuration of FIG. 3 is that, during the charging phase, node $V_1$ reaches $V_{DD}$, but the output voltage will remain at $V_{DD}-V_{TN}$ such that MN1 is just on (wherein $V_{TN}$ is the threshold voltage of the NMOS driver MN1).

In addition, during discharging, node $V_2$ drops to zero, but the output voltage will drop to $V_{TP}$ such that MP2 is just on, (wherein $V_{TP}$ is the threshold voltage of the PMOS driver MP2). In order to address these problems, the pad driver circuit of FIG. 3 uses two amplifiers. Amplifier A1 turns on the switch MP1 during charging when the voltage at node $V_1$ approaches $V_{DD}$. In this case, the capacitive load charges through the on-resistance of MP1 to $V_{DD}$. Amplifier A2 is used to turn on the switch MN2 during discharging when the voltage at node $V_2$ approaches zero. In this case, the capacitive load discharges through the on-resistance of MN2 to zero. However, this adds to the complexity of the circuit design because of the two high-speed amplifiers A1 and A2. Another drawback of this architecture arises during the charging and discharging phases when the output voltage approaches $V_{DD}-V_{TN}$ and $V_{TP}$, respectively. Under these conditions, the charging and discharging process becomes dependent on the load capacitance and the on-resistance of switches MP1 and MN2, respectively.

Therefore, a need exists for improved pad drivers.

SUMMARY

Described herein are electronic pad driver circuits for driving one or more input/output pads of an integrated circuit device. In one aspect, the circuits described herein allow for rail-to-rail charging and discharging of input/output pads. In a further aspect, the rates of charging and discharging of the input/output pads by the pad driver circuits disclosed herein are constant and not dependent on the load capacitance.

In one aspect, the pad driver circuits described herein comprise a voltage source, such as a battery, adaptable for maintaining the NMOS and PMOS transistors of one or more source follower circuits at saturation in order to ensure the rail-to-rail charging and discharging of the input/output pads. In a further aspect, one or more switches are provided to connect the source follower circuits to a voltage generator appropriately during a pre-charging or a pre-discharging phase. In one more aspect, the components of the exemplary pad driver circuit described herein are simple and easy to assemble and hence do not add to the complexity of the larger circuit comprised within the subject integrated circuit.

Additional features and advantages will become apparent from the following detailed description of the illustrated embodiments, which proceeds with reference to the accompanying drawings.

DETAILED DESCRIPTION

The disclosed invention is direct toward all novel and unobvious features and aspects of the embodiments of the system and methods described herein both alone and in various combinations and sub-combinations thereof. The disclosed features and aspects of the embodiments can be used alone or in various novel and unobvious combinations and sub-combinations with one another. The invention is not limited to embodiment have all of the advantages of the embodiment disclosed herein or that solves all of the problems of prior designs.

Figure 15:
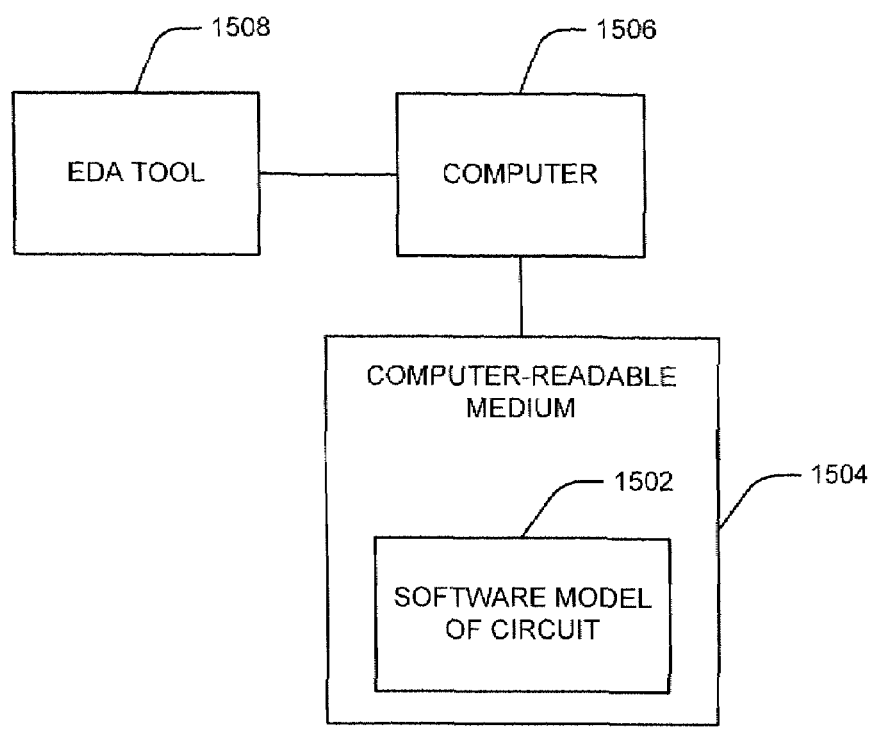
FIG. 15 is a block diagram illustrating one embodiment of a system for simulating the operation of an electronic device.

The circuits disclosed herein are merely exemplary in nature and are used to illustrate the principles described below. Other circuits that implement the principles taught herein are within the scope of this disclosure. Also, as shown in one embodiment in FIG. 15, the circuits described herein can be implemented as a software model 1502 stored on a computer-readable medium 1504 and executed on a computer 1506 to emulate the operation of a circuit. Some of the disclosed circuits, for example, can be implemented as software representations that are part of an Electronic Design Automation (EDA) tool 1508 for simulating the operation of a collection of electronic devices. Such models or software representations can be executed on a single computer or a networked computer. For clarity, only those aspects of the software germane to these disclosed methods are described; product details well known in the art are omitted. For the same reason, the computer hardware is not described in detail.

Figure 1:
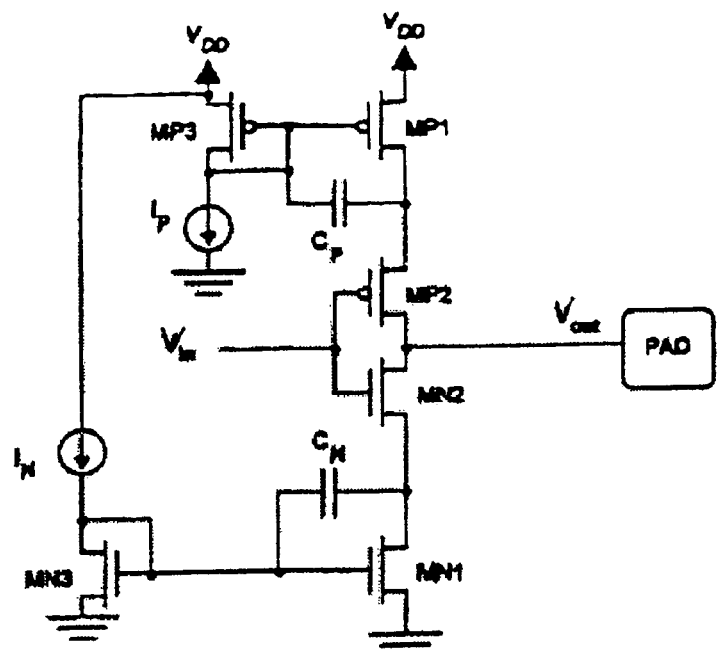
FIG. 1 is a circuit diagram illustrating one known pad driver circuit charging and discharging directly through a current source.
Figure 2:
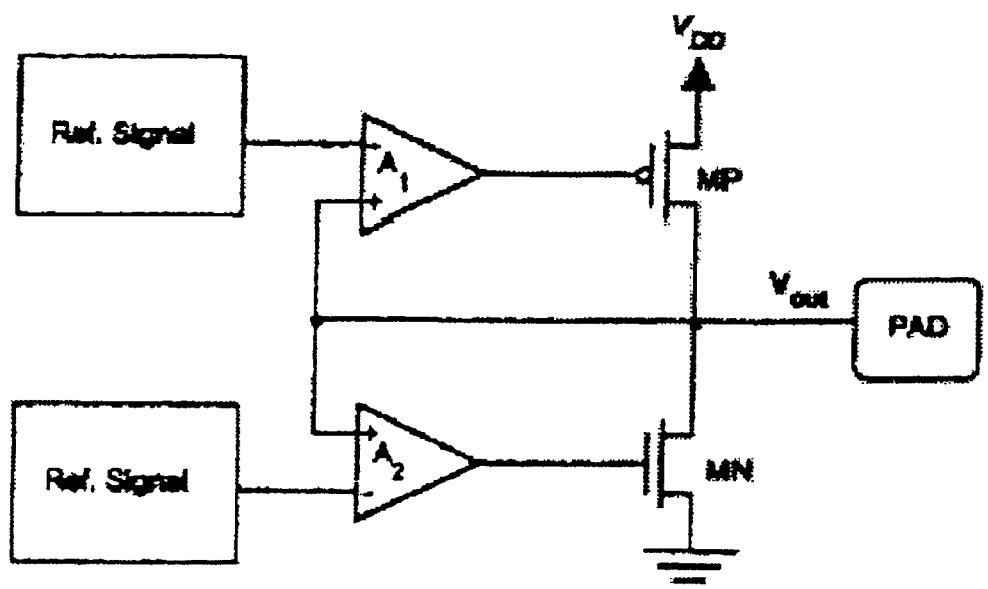
FIG. 2 is a circuit diagram illustrating one known pad driver circuit comprising a negative feedback to control charging and discharging.
Figure 3:
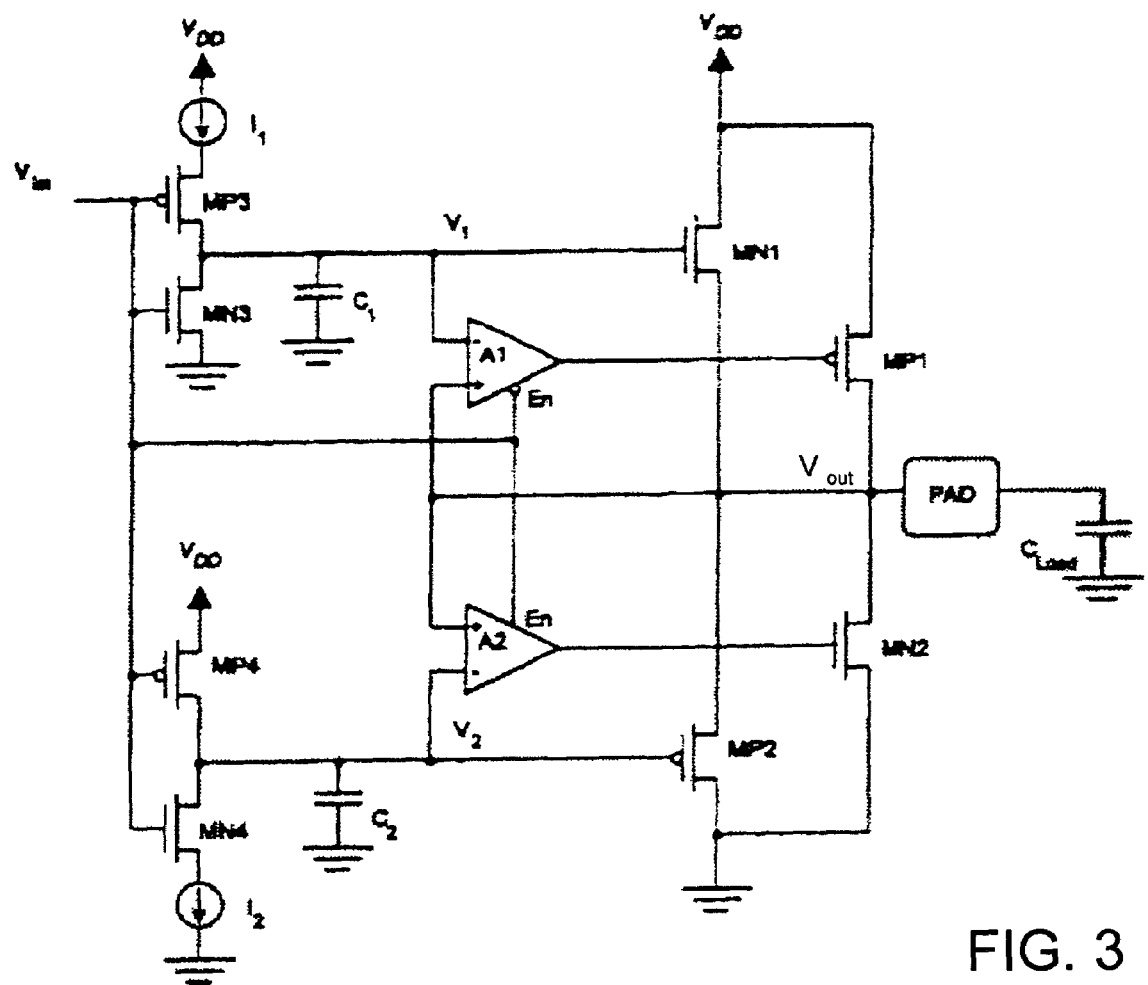
FIG. 3 is a circuit diagram illustrating one known pad driver circuit comprising operational amplifiers for buffering during charging and discharging.
Figure 4:
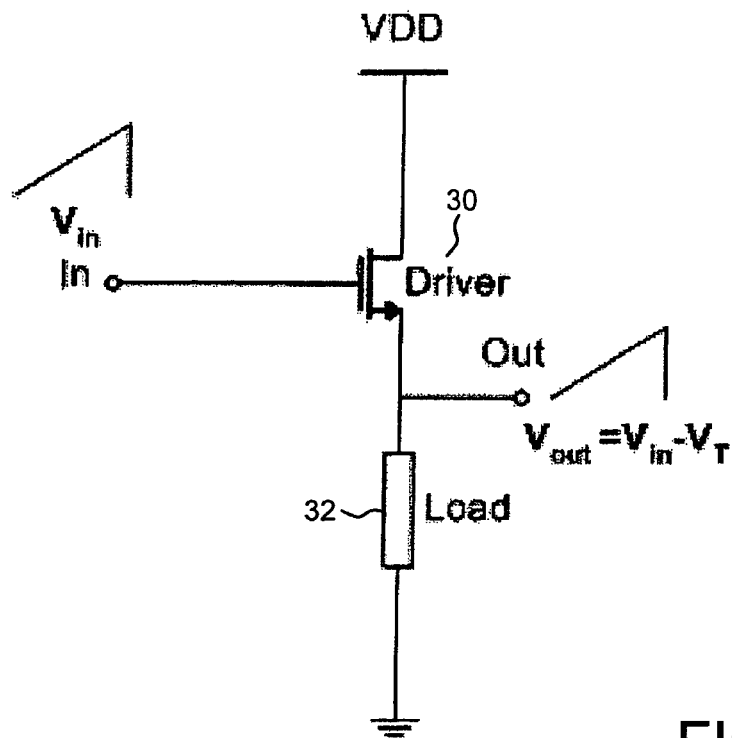
FIG. 4 is a circuit diagram illustrating a conventional NMOS source follower circuit.
Figure 5:
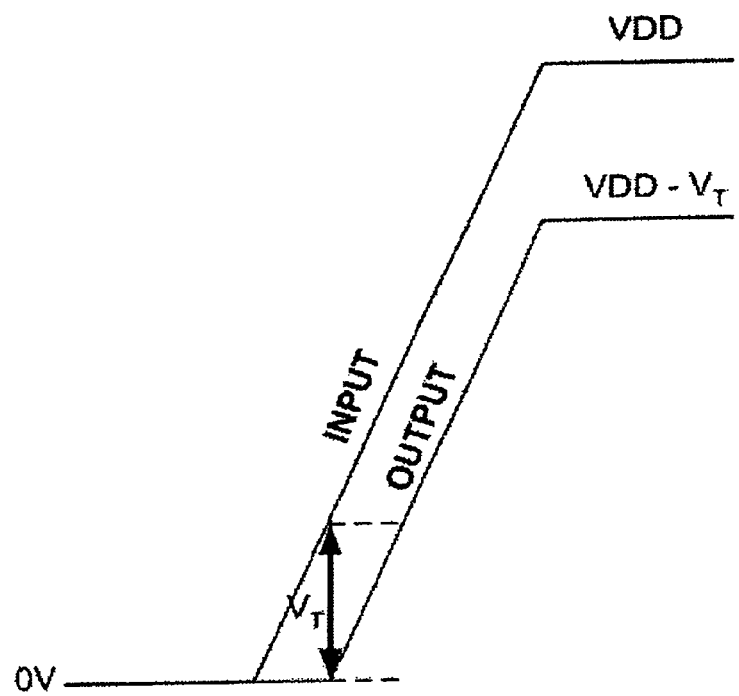
FIG. 5 is a block diagram illustrating the comparison between the output and input signals of the source follower circuit of FIG. 4.

An exemplary load insensitive pad driver is based on modifications to the source follower architecture, as shown in FIG. 4. Provided that the transistor size (W/L) is large enough compared to the capacitive load 32, the source follower is characterized by a low output impedance of its driver transistor 30. This circuit thus acts as a voltage source where the output ($V_{OUT}$) tracks the input signal ($V_{IN}$) regardless of the value of the output load. The main disadvantage of this conventional source follower is the limitation of the output swing to $V_{DD}-V_T$ when the input reaches $V_{DD}$. (See FIG. 5). This can be explained as follows: When $V_{IN}$ increases from zero to $V_T$, the driver transistor 30 is off and the output voltage is zero. When the input $V_{IN}$ exceeds $V_T$, the driver goes into saturation and the output follows the input as shown in FIG. 5. When the input reaches $V_{DD}$, the output settles on $V_{DD}-V_T$. The output in this example cannot exceed $V_{DD}-V_T$, because if it does, the driver transistor 30 is turned off.

Figure 6:
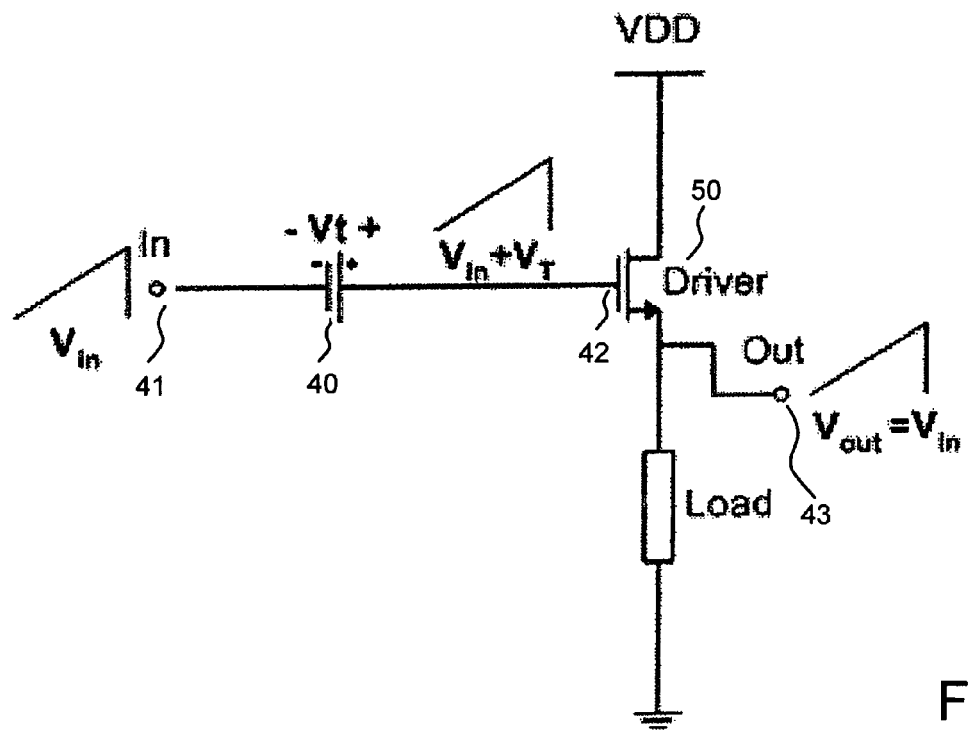
FIG. 6 is a circuit diagram illustrating an NMOS source follower circuit comprising battery for maintaining the NMOS transistor of the circuit in saturation.
Figure 7:
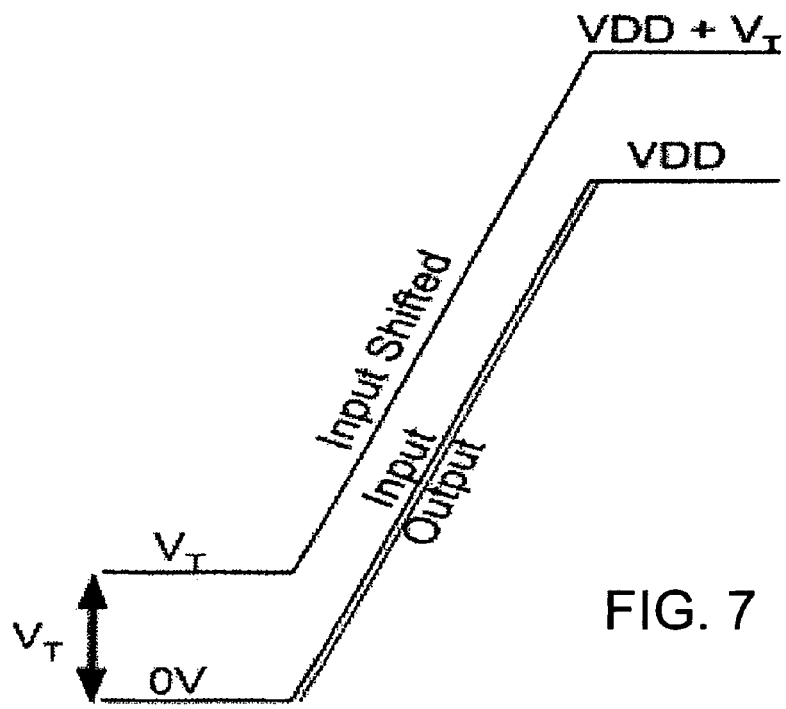
FIG. 7 is a block diagram illustrating the comparison between the input and output signals of the source follower circuit of FIG. 6.

Conceptually speaking, as shown in FIG. 6, a load independent pad driver circuit that swings rail-to rail (e.g., from zero to $V_{DD}$) can be implemented by placing a voltage source, such as a series DC supply 40 of value $V_t$ between the input 41 and the gate 42 of the driver 50, which causes the input to the driver gate at 42 to shift from the input by $V_T$. Thus, while the input $V_{IN}$ (41) charges up from zero to $V_{DD}$, the input to the driver gate at 42 charges up from $V_t$ to $V_{DD}+V_T$. In addition, in this case, the output also charges from zero to $V_{DD}$, and follows the input signal, as shown in FIG. 7. This assures that the driver transistor 50 is in saturation at all times and that the output at 43 swings rail-to-rail (e.g., from zero to $V_{DD}$).

Figure 8:
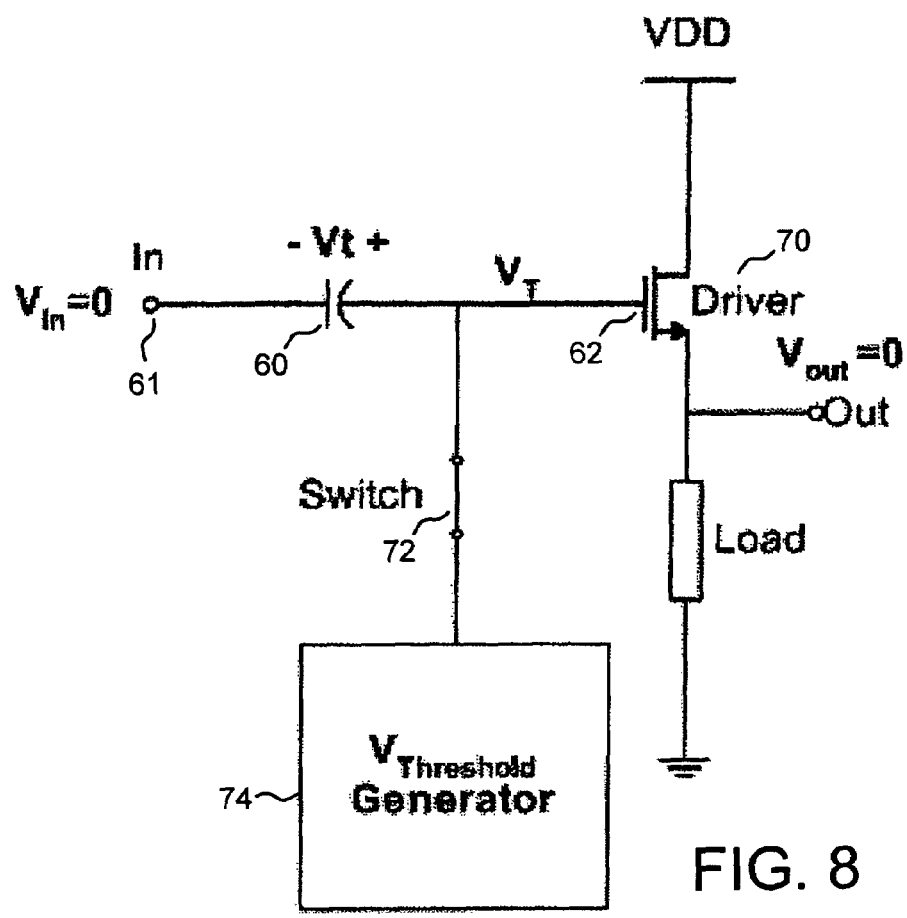
FIG. 8 is block diagram illustrating the source follower circuit of FIG. 6 coupled to a voltage generator via a closed switch during a pre-charge phase.
Figure 9:
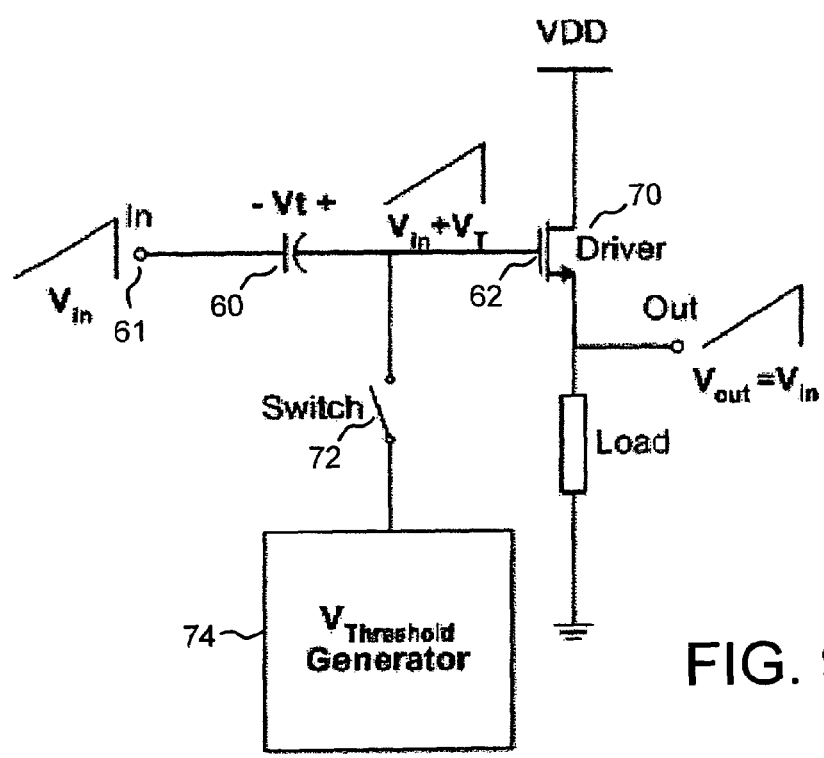
FIG. 9 is a block diagram illustrating the source follower circuit of FIG. 6 in a charge phase with the voltage generator disconnected from the circuit.

An exemplary implementation of this concept is shown in FIGS. 8 and 9. In this example, a series capacitor 60 (serving as a voltage source, in this case like a battery) is connected between the input 61 and the driver gate 62 of driver transistor 70. The operation of this circuit has precharging and charging phases. During the precharging phase, see FIG. 8, switch 72 is closed and a voltage threshold generator circuit 74 that generates a voltage $V_T$ precharges the series capacitor 60 to voltage $V_T$. The voltage $V_T$ corresponds to the threshold voltage of the driver (e.g., the NMOS threshold voltage of the driver in this example). During the charging phase, see FIG. 9, the switch 72 is open and the voltage generator $V_T$ 74 is disconnected from the driver gate 62 and the input 61 charges from zero to $V_{DD}$. In this case, the capacitor sustains its initial charge of $V_T$ due to the absence of a charge leakage path, and the driver gate 62 will charge (ramp up) from $V_T$ to $V_{DD}+V_T$ in response to the input signal ramping up from zero to $V_{DD}$. This is so because, the voltage across the capacitor 60 is maintained at $V_T$, and thus, the output ($V_{OUT}$) follows the input and charges from zero to $V_{DD}$ as the input voltage charge from zero to $V_{DD}$. This is possible at least in part because the driver remains in saturation during the entire charging phase.

Figure 10:
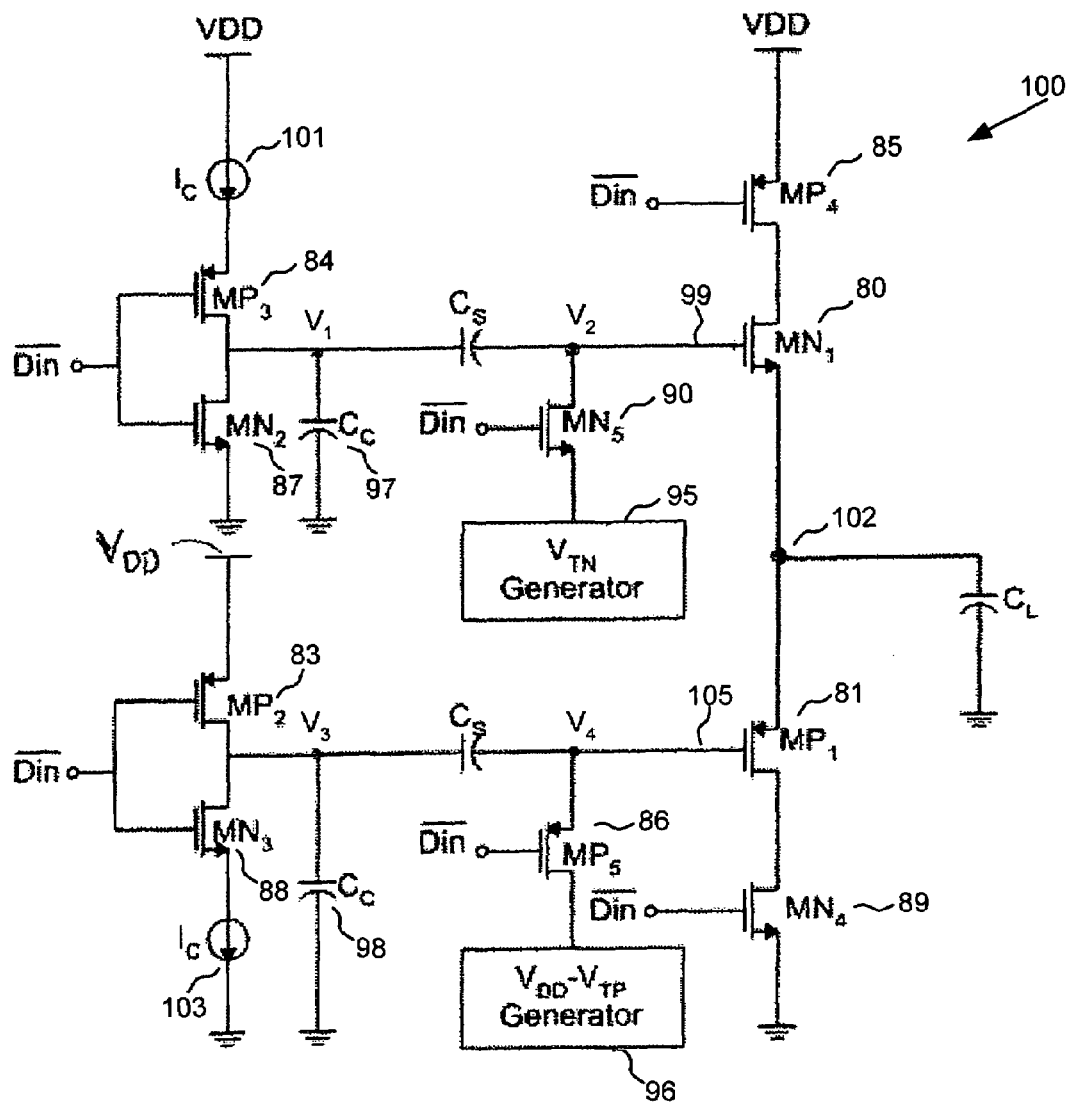
FIG. 10 is a detailed pad driver circuit comprising charge capacitors for preserving threshold voltages needed to retain the NMOS and PMOS driver transistors in saturation during the charging and discharging phases, respectively.

At least based on the foregoing discussion, a load independent pad driver circuit 100 can be implemented, such as in the exemplary embodiment shown in FIG. 10. Transistors $MN_1$ at 80 and $MP_1$ at 81 represent the source follower drivers. Transistors $MP_2$-$MP_5$ (83, 84, 85, and 86) are PMOS switches. Transistors $MN_2$-$MN_5$ (87, 88, 89, and 90) are NMOS switches. The circuit 100 is driven by two simple $V_T$ extractors 95 and 96, one for the NMOS driver at 95 and the other for the PMOS driver at 96.

Referring to the circuit 100 of FIG. 10, during the pre-charge phase when the input $\overline{D_{IN}}$ goes high (rises), transistor $MN_2$ (87) is switched on. As a result, capacitor $C_C$ at 97 is discharged to zero and the transistor $MN_5$ at 90 is turned on so that the gate 99 of transistor $MN_1$ at 80 is charged with $V_{TN}$, which is the threshold voltage for the transistor $MN_1$ at 80. Then during the charging phase, when $\overline{D_{IN}}$ goes low, $MN_2$ at 87 and $MN_5$ at 90 turn off, while $MP_3$ at 84 and $MP_4$ at 85 turn on, the current source $I_C$ at 101 starts to charge $C_C$ at 97 at a constant rate according to the relation:

$$V_1 = \frac{I_c}{C_c} t$$

In addition, since voltage at $V_2$ is shifted from $V_1$ by a voltage of $V_{TN}$, $V_2$ can be determined by:

$$V_2 = \frac{I_c}{C_c} t + V_{TN}$$

Because of this shift, as node $V_1$ ramps from zero to $V_{DD}$, node $V_2$ ramps from $V_{TN}$ to $V_{DD}+V_{TN}$ and the output 102 ramps from zero to $V_{DD}$ and follows the ramping of the node $V_1$.

The discharging process is done in a manner similar to the charging process, but with the aid of a lower inverter pair 83 and 88. When $\overline{D_{IN}}$ goes low, $MP_2$ at 83 and $MP_5$ at 86 turn on, thus, the capacitor $C_C$ at 98 is charged to $V_{DD}$ and the driver gate at 105 of $MP_1$ at 81 is charged to $V_{DD}-V_{TP}$, where $V_{TP}$ is threshold voltage for $MP_1$ at 81. Then during the discharging phase when $\overline{D_{IN}}$ goes low, $MP_2$ at 83 and $MP_5$ at 86 turn off, while $MN_3$ at 88 and $MN_4$ at 89 turn on. Thus, the current source $I_C$ at 103 discharges the capacitor $C_c$ at 98 with a constant rate and voltage, which is given by:

$$V_3 = V_{DD} - \frac{I_c}{C_c}t$$

Since the voltage at node $V_4$ is shifted from the voltage at $V_3$ by $-V_{TP}$, the voltage at $V_4$ can be given by:

$$V_4 = V_{DD} - \frac{I_c}{C_c}t - V_{TP}$$

As a result, as the voltage at node $V_3$ discharges from $V_{DD}$ to zero, the voltage at node $V_4$ discharges from $V_{DD}-V_{TP}$ to $-V_{TP}$ and the output voltage at 103 discharges from $V_{DD}$ to zero following the voltage discharge at node $V_3$.

The charging of $MP_1$ at 81 gate by $V_{DD}-V_{TP}$ and the charging of the output pad load by $MN_1$ at 80 occurs simultaneously in this example during the falling edge of the input signal $\overline{D_{IN}}$. In addition, charging of $MN_1$ at 80 gate with $V_{TN}$ and the discharging of output pad load by $MP_1$ at 80 occurs simultaneously during the rising edge of the input signal $\overline{D_{IN}}$.

Figure 11:
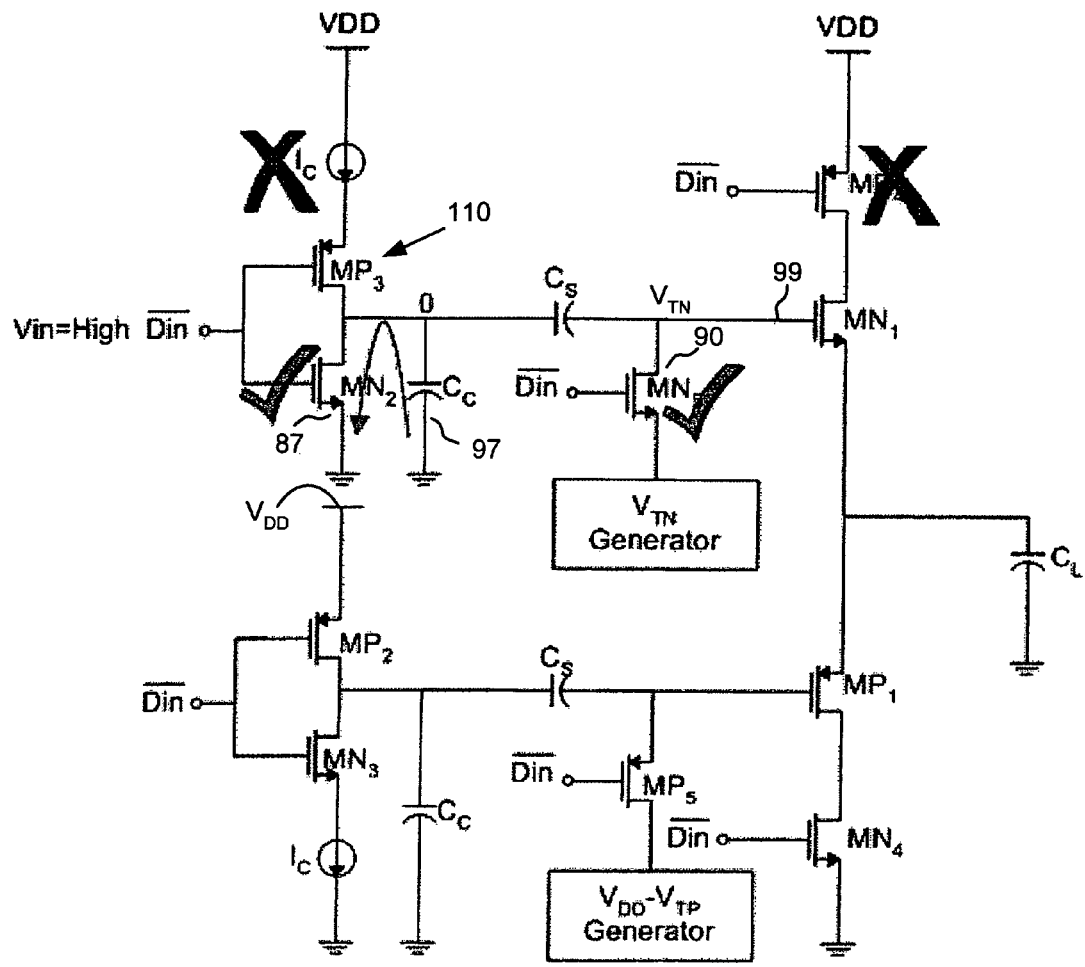
FIG. 11 is a circuit diagram illustrating the condition of the pad driver circuit of FIG. 10 during a pre-charge phase.

FIGS. 11-14 illustrate various exemplary scenarios and paths for charging and discharging of the output pad in conjunction with the rise and fall of the input signal $\overline{D_{IN}}$. FIG. 11 illustrates the exemplary precharging scenario. In this case, the input $\overline{D_{IN}}$ is pulled high, thus, turning on $MN_2$ at 87, and pulling the upper inverter pair at 110 high and discharging the capacitor at 97 to zero. Meanwhile, the gate 99 is charged to the threshold voltage $V_{TN}$ by transistor $MN_5$ at 90 being turned on.

Figure 12:
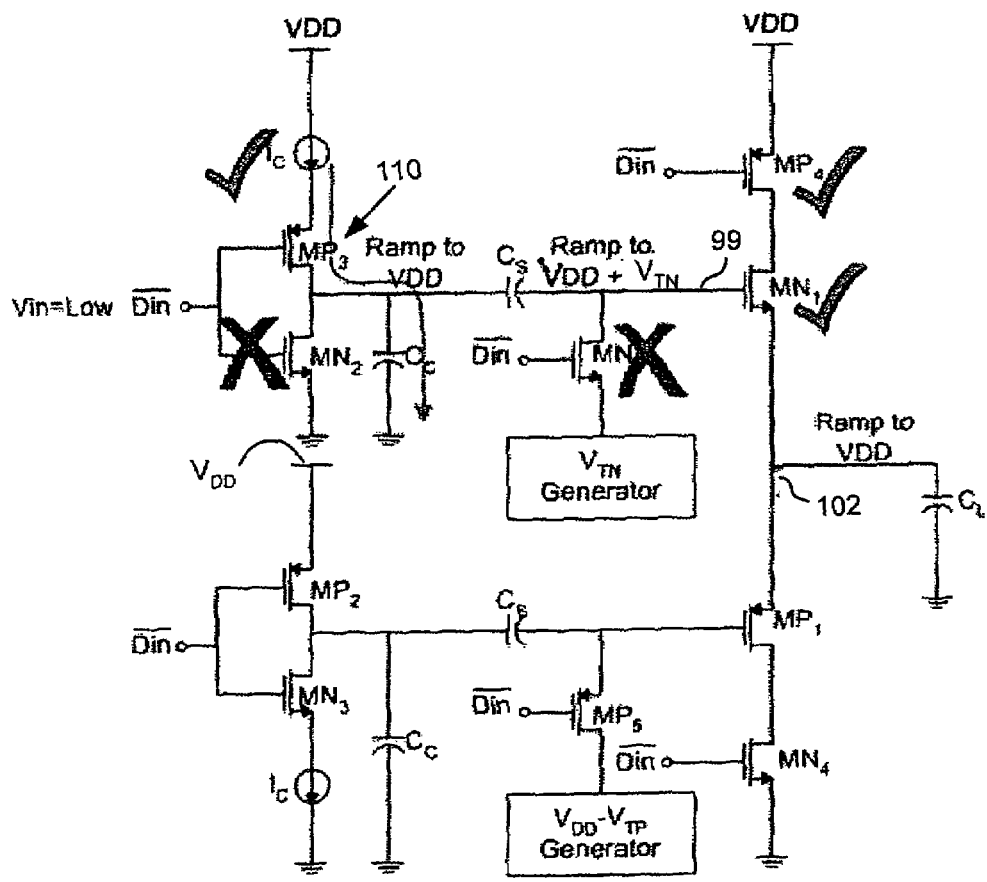
FIG. 12 is a circuit diagram illustrating the condition of the pad driver circuit of FIG. 10 during a charge phase.

FIG. 12 illustrates the charging phase. In this phase, the input $\overline{D_{IN}}$ is low. The output of this upper inverter pair at 110 is ramped up to $V_{DD}$ at a constant rate of $I_C/C_C$. Meanwhile, the gate 99 is ramps up to $V_{DD}+V_{TN}$, and thus, causing the output 102 to ramp up from zero to $V_{DD}$.

Figure 13:
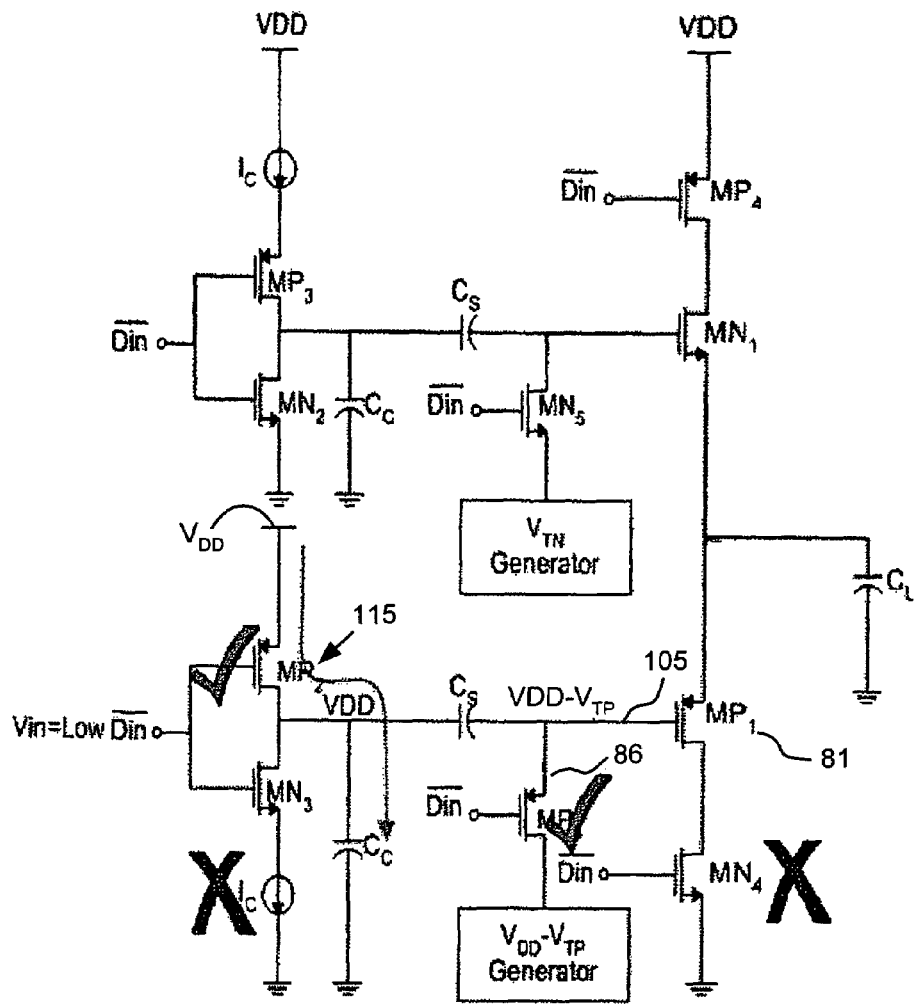
FIG. 13 is a circuit diagram illustrating the condition of the pad driver circuit of FIG. 10 during a pre-discharge phase.

FIG. 13 illustrates the exemplary pre-discharging phase. In this phase, the input $\overline{D_{IN}}$ is pulled low. As a result, the output of the lower inverter pair at 115 is pulled high and $MP_5$ at 86 conducts voltage $-V_{TP}$ to the gate 105 of $MP_1$ at 81, which is eventually charged to $V_{DD}-V_{TP}$.

Figure 14:
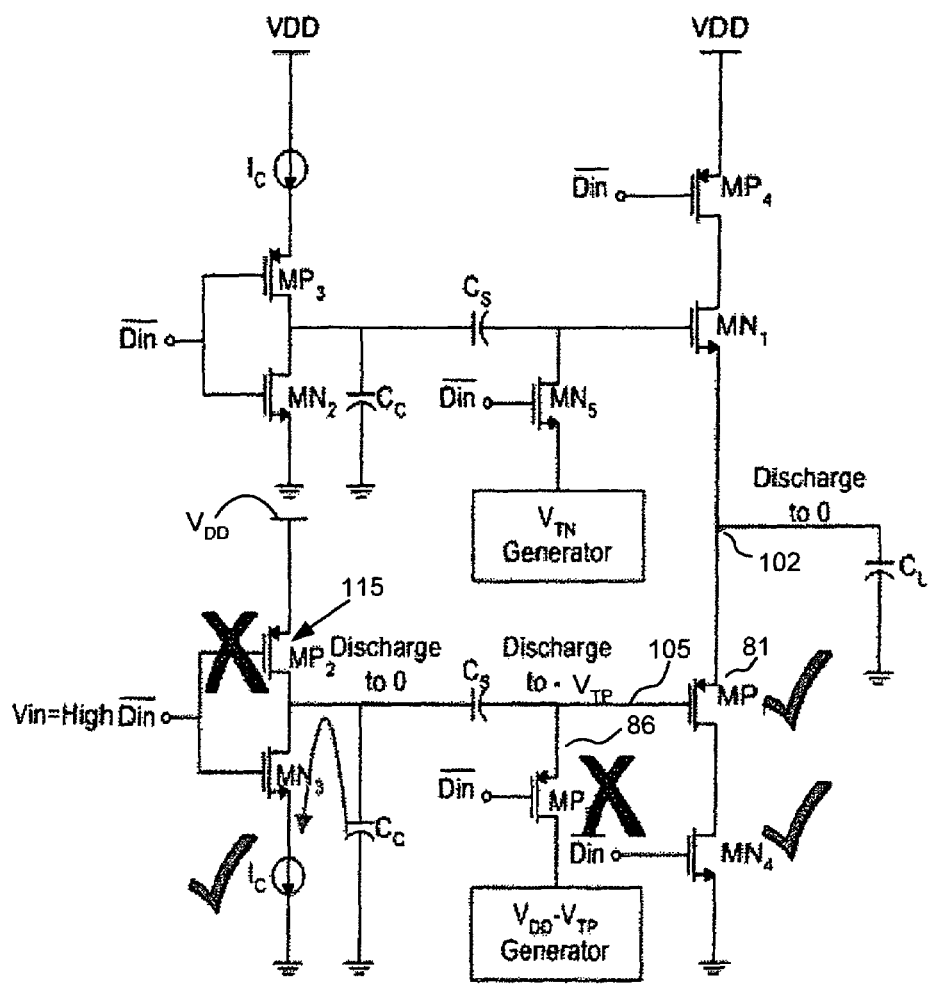
FIG. 14 is a circuit diagram illustrating the condition of the pad driver circuit of FIG. 10 during a discharge phase.

FIG. 14 illustrates the discharging phase. In this phase $\overline{D_{IN}}$ is set high and the output of the lower inverter pair at 115 ramps down at the rate of $I_C/C_C$. The gate 105 of transistor $MP_1$ at 81 ramps down to $-V_{TP}$ causing the output 102 to follow by discharging down from $V_{DD}$ to zero. In these examples described above, the rate of charging or discharging as the case may be is not dependent on the load capacitance $C_L$, which may vary. Instead, the charge and discharge rates are held constant (e.g., $I_C/C_C$).

Having described and illustrated the principles of our invention with reference to the illustrated embodiments, it will be recognized that the illustrated embodiments can be modified in arrangement and detail without departing from such principles. Elements of the illustrated embodiment simulated in software may be implemented in hardware and vice versa. Also, the technologies from any example can be combined with the technologies described in any one or more of the other examples.

In view of the many possible embodiments to which the principles of the invention may be applied, it should be recognized that the illustrated embodiments are examples of the invention and should not be taken as a limitation on the scope of the invention. For instance, various components of systems and tools described herein may be combined in function and use. We therefore claim as our invention all subject matter that comes within the scope and spirit of these claims.

We claim:

1. A pad driver circuit for driving input/output pads of an integrated circuit, the pad driver circuit comprising:
   a charging source follower circuit having a pre-charge voltage source adapted for receiving signals from a pre-charge voltage generator such that the pre-charge voltage source can maintain at least a first transistor within the charging source follower circuit saturated at a threshold voltage related to the first transistor, the pre-charge voltage source being between an input to the pad driver circuit and the first transistor, wherein a pre-charge switch is between the pre-charge voltage source and the pre-charge voltage generator; and
   a discharging source follower circuit having a pre-discharge voltage source adapted for receiving signals from a pre-discharge voltage generator such that the pre-discharge voltage source can maintain at least a second transistor within the discharging source follower circuit saturated at a threshold voltage related to the second transistor, the pre-discharge voltage source being between the input to the pad driver circuit and the second transistor, wherein a pre-discharge switch is between the pre-discharge voltage source and the pre-discharge voltage generator, and wherein the charging source follower circuit and the discharging source follower circuit are coupled to an output.

2. The pad driver circuit of claim 1 further comprising, a pre-discharge voltage generator for generating the signals needed to maintain the second transistor within the discharging source follower circuit saturated at the threshold voltage related to the second transistor.

3. At least one computer-readable medium having stored thereon computer-executable instructions configured to cause a computer to perform a method comprising:
   providing an NMOS source follower circuit model having a pre-charge voltage source model adapted for receiving first signals such that the pre-charge voltage source model can simulate maintaining at least one NMOS transistor model within the NMOS source follower circuit model saturated at a threshold voltage related to the NMOS transistor model;
   providing a PMOS source follower circuit model having a pre-discharge voltage source model adapted for receiving second signals such that the pre-discharge voltage source model can simulate maintaining at least one PMOS transistor model within the PMOS source follower circuit model saturated at a threshold voltage related to the PMOS transistor model;
   connecting an NMOS switch model between a gate terminal of the NMOS source follower circuit model and an NMOS threshold voltage generator model;
   connecting a PMOS switch model between a gate terminal of the PMOS source follower circuit model and a PMOS threshold voltage generator model; and connecting the NMOS source follower circuit model and the PMOS source follower circuit model to generate an output signal at an output model.

4. A pad driver circuit for driving input/output pads of an integrated circuit, the pad driver circuit comprising:
a charging source follower circuit having a pre-charge voltage source adapted for receiving first signals such that the pre-charge voltage source can maintain at least one NMOS transistor within the charging source follower circuit saturated at a threshold voltage related to the NMOS transistor, the pre-charge voltage source being between an input to the pad driver circuit and the NMOS transistor;
a discharging source follower circuit having a pre-discharge voltage source adapted for receiving second signals such that the pre-discharge voltage source can maintain at least one PMOS transistor within the discharging source follower circuit saturated at a threshold voltage related to the PMOS transistor, the pre-discharge voltage source being between the input to the pad driver circuit and the PMOS transistor, wherein the charging source follower circuit and the discharging source follower circuit are coupled to an output;
a pre-charge voltage generator for generating the signals needed to maintain the at least one NMOS transistor within the charging source follower circuit saturated at the threshold voltage related to the NMOS transistor; and
a pre-charge switch that is turned on during a pre-charging phase for conveying to the at least one NMOS transistor the signals needed to maintain the at least one NMOS transistor within the charging source follower circuit saturated at the threshold voltage related to the NMOS transistor.

5. The pad driver circuit of claim 4 wherein, the pre-charge switch connects the pre-charge voltage source to the pre-charge voltage generator.

6. The pad driver circuit of claim 4 wherein, the pre-charge switch comprises an NMOS transistor.

7. The pad driver circuit of claim 4 wherein, the pre-charge voltage source comprises a capacitor connected to the gate terminal of the NMOS source follower circuit.

8. A pad driver circuit for driving input/output pads of an integrated circuit, the pad driver circuit comprising:
a charging source follower circuit having a pre-charge voltage source adapted for receiving first signals such that the pre-charge voltage source can maintain at least one NMOS transistor within the charging source follower circuit saturated at a threshold voltage related to the NMOS transistor, the pre-charge voltage source being between an input to the pad driver circuit and the NMOS transistor;
a discharging source follower circuit having a pre-discharge voltage source adapted for receiving second signals such that the pre-discharge voltage source can maintain at least one PMOS transistor within the discharging source follower circuit saturated at a threshold voltage related to the PMOS transistor, the pre-discharge voltage source being between the input to the pad driver circuit and the PMOS transistor, wherein the charging source follower circuit and the discharging source follower circuit are coupled to an output;
a pre-discharge voltage generator for generating the signals needed to maintain at least one PMOS transistor within the discharging source follower circuit saturated at a threshold voltage related to the PMOS transistor; and
a pre-discharge switch that is turned on during a pre-discharging phase for conveying the signals needed to maintain at least one PMOS transistor within the discharging source follower circuit saturated at the threshold voltage related to the PMOS transistor.

9. The pad driver circuit of claim 8 wherein, the pre-discharge switch connects the pre-discharge voltage generator to the pre-discharge voltage source.

10. The pad driver circuit of claim 8 wherein, the pre-discharge voltage source comprises a capacitor connected to the input of the pad driver circuit.

11. The pad driver circuit of claim 8 wherein, the pre-discharge switch comprises a PMOS transistor.

12. A circuit simulation tool programed to simulate an electronic circuit comprising at least one pad driver of claim 1.

13. The computer readable medium of claim 3 wherein the pre-charge voltage source model comprises a first capacitor model connected to the NMOS switch model and the gate terminal of the NMOS source follower circuit model wherein, the first capacitor model is capable of simulating retaining the threshold voltage sufficient to maintain the NMOS source follower model in saturation.

14. The computer-readable medium of claim 13 wherein, the gate terminal of the NMOS source follower circuit model is also connected to an input signal source model and a first current source model via the first capacitor model connected to the NMOS switch model and the gate terminal of the NMOS source follower circuit model and a first NMOS and PMOS inverter pair model.

15. The computer-readable medium of claim 14 wherein the pre-discharge voltage source model comprises a second capacitor model connected to the PMOS switch model and the gate terminal of the PMOS source follower circuit model wherein, the first capacitor model is capable of simulating retaining the threshold voltage sufficient to maintain the PMOS source follower model in saturation.

16. The computer-readable medium of claim 15 wherein, the gate terminal of the PMOS source follower circuit model is also connected to the input signal source model and a second current source model via the second capacitor model connected to the PMOS switch model and the gate terminal of the PMOS source follower circuit model and a second NMOS and PMOS inverter pair model.

17. The computer-readable medium of claim 16 wherein, the method further comprises providing to the first NMOS and PMOS inverter pair model and the second NMOS and PMOS inverter pair model a simulated input signal that ranges from zero to $V_{DD}$.

18. A method of operating a pad driver circuit, the circuit comprising a driver input, a driver output, a capacitor and a driver transistor between the driver input and the driver output, and a switch between the capacitor and a voltage source; wherein the driver transistor has a threshold voltage $V_T$, the method comprising:
closing the switch to cause the voltage source to charge the capacitor to $V_T$ such that $V_T$ is applied to an input of the driver transistor;
opening the switch;
applying an input voltage $V_{in}$ to the driver input and through the capacitor such that a voltage of $V_{in}+V_T$ is applied to the input of the driver transistor, and such that an output voltage equal to $V_{in}$ is provided on the driver output.

19. A pad driver circuit comprising:
an input;

a driver transistor having a threshold voltage $V_T$ and a driver output;
a capacitor between the input and the driver transistor;
a voltage generator; and
a switch between the capacitor and the voltage generator, wherein when the switch is in a closed position the voltage generator charges the capacitor to the threshold voltage $V_T$ such that the capacitor provides the threshold voltage $V_T$ to an input of the driver transistor and such that upon opening the switch and applying an input voltage to the input, an output voltage on the driver output is equal to the input voltage.

* * * * *